United States Patent [19]

Mowry

[11] Patent Number: 5,161,982
[45] Date of Patent: Nov. 10, 1992

[54] REACTIVE BASE FOR CANTILEVERED CONNECTOR

[75] Inventor: Thomas E. Mowry, Cardiff, Calif.

[73] Assignee: Teledyne Kinetics, San Diego, Calif.

[21] Appl. No.: 865,653

[22] Filed: Apr. 7, 1992

Related U.S. Application Data

[63] Continuation of Ser. No. 677,759, Mar. 29, 1991, abandoned.

[51] Int. Cl.⁵ .............................................. H01R 9/09
[52] U.S. Cl. ......................................... 439/68; 439/69; 439/74; 439/76
[58] Field of Search ................... 439/68, 69, 74, 76, 439/293, 493, 606

[56] References Cited

U.S. PATENT DOCUMENTS

| | | | |
|---|---|---|---|
| 4,538,864 | 9/1985 | Ichimura | 439/69 |
| 4,552,422 | 11/1985 | Bennett et al. | 439/69 |
| 5,007,844 | 4/1991 | Mason et al. | 439/68 |

OTHER PUBLICATIONS

IBM Tech. Disclosure Bulletin vol. 10 No. 7 Dec. 1967; pp. 892-893 "Miniature Electrical Connector"; Kennedy.

Primary Examiner—Paula A. Bradley
Attorney, Agent, or Firm—Nydegger & Associates

[57] ABSTRACT

A connector assembly in accordance with the present invention includes a base which can be positioned or mounted on a substrate. At least one contact beam is cantilevered on the base and has a deflectable free end which is distanced from the base and a fixed end which is attached to the base. At least one rigid reactive beam extends from the base to counteract the forces which are generated on the base when the free end of the contact beam is deflected to move from a first configuration wherein the beam is unstressed, and into a second configuration wherein the beam is stressed. Further, the connector assembly is positioned on the substrate so that when a printed circuit board is joined with the substrate, the free end of the contact beam is urged against the printed circuit board to move the contact beam from its first configuration into its second configuration to establish electrical contact between the contact beam and the printed circuit board. The fixed end of each contact beam has a portion exposed to provide a point for connecting the contact beam with an electronic device.

12 Claims, 1 Drawing Sheet

REACTIVE BASE FOR CANTILEVERED CONNECTOR

This is a continuation of co-pending application Ser. No. 07/677,759, filed on Mar. 29, 1991 now abandoned.

FIELD OF THE INVENTION

The present invention pertains generally to electrical connector assemblies. More specifically, the present invention pertains to electrical connector assemblies which must be operable in an extremely flat profile. The present invention is particularly, but not exclusively, useful for connecting a printed circuit board to an electrical device where dimensional requirements dictate minimal space availability between the electrical device and the printed circuit board.

BACKGROUND OF THE INVENTION

Electronic systems typically incorporate several electrical components which require reliable interconnections for the proper operation of the system. As the sophistication of these systems has increased, there has been a trend toward designing the system so that individual components can be easily removed and replaced. To do this, it is obviously necessary for there to be reliable connections between the various components regardless whether the component is an original component or a replacement component.

Numerous connector assemblies have been designed and developed for use in providing an electrical connection between the components of electrical systems. One type of connector assembly that is widely used for this purpose relies on a deflectable or bendable contact beam which has one free end and one end fixedly attached to, or mounted on, one of the components in the connection. To make the electrical connection between these components, the components are joined together to urge the free end of the contact beam against the other component in the combination.

In some applications, it happens that space requirements are of the utmost importance. Indeed, many examples can be recited wherein it is desirable for there to be as little space as possible between engaged electrical components. When this is the case, the design of the connector is critical. For the specific case where a deflectable contact beam-type connector assembly is to be used, the considerations which must be addressed in the design effort include: 1) the necessary force to be generated between the contact beam and the other electrical component to ensure a functional and reliable electrical connection; 2) the degree of bendability or deflectability of the contact beam which is required to make the proper electrical connection; 3) the longevity and repeatability of the electrical connection between the engaged components; and 4) the integrity of the combination of electronic components and connector assembly.

In light of the above it is an object of the present invention to provide an electrical connector which is operable with an extremely flat profile. It is another object of the present invention to provide an electrical connector which will support a contact beam with sufficient deflection to generate the contact force necessary for a proper electrical connection. Still another object of the present invention is to provide an electrical connector which will maintain the integrity of the combination when it is used to connect electronic components. Yet another object of the present invention is to provide an electrical connector which is simple to use, relatively easy to manufacture and comparatively cost effective.

SUMMARY OF THE INVENTION

A connector assembly in accordance with the present invention includes a base which can be positioned or mounted on a substrate, such as a die casting. At least one contact beam is cantilevered on the base. In its combination with the base, each contact beam has a deflectable free end which is distanced from the base and a fixed end which is attached to the base. The connector assembly also includes at least one rigid reactive beam which is integral with the base and extends therefrom to counteract the forces which are generated on the base when the contact beam is deflected.

As intended for the connector assembly of the present invention, the free end of the contact beam is deflectable to move the beam between a first configuration wherein the beam is unstressed, and a second configuration wherein the beam is stressed. Further, the connector assembly is positioned on the substrate so that when a printed circuit board is joined with the substrate, the free end of the contact beam is urged against the printed circuit board. This moves the contact beam from its first configuration into its second configuration to establish electrical contact between the contact beam and the printed circuit board.

The end of each contact beam which is fixed to the base can have a portion of the end exposed to provide a point for connecting the contact beam with an electronic device. The substrate may itself be part of the device or may be otherwise connectable with the device. In any event, electrical leads from the device can be connected to respective exposed portions of the fixed ends of the contact beams to establish electrical contacts between the electronic device and the printed circuit board through the contact beams.

The novel features of this invention, as well as the invention itself, both as to its structure and its operation will be best understood from the accompanying drawings, taken in conjunction with the accompanying description, in which similar reference characters refer to similar parts, and in which:

DESCRIPTION OF THE PREFERRED EMBODIMENTS

Figure 1:
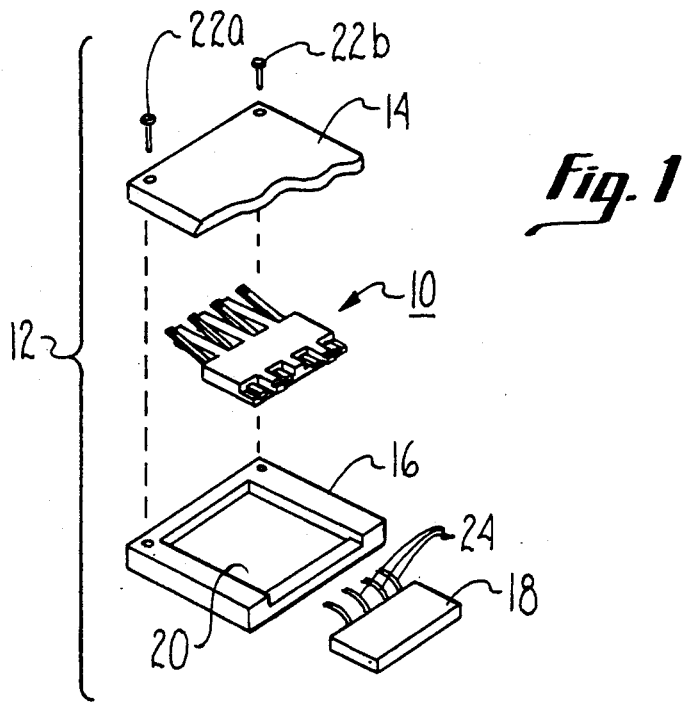
FIG. 1 is a perspective view of the connector assembly in an exploded relationship with electronic components it is intended to electrically connect.

Referring initially to FIG. 1, a connector assembly according to the present invention is shown and generally designated 10. As shown, the connector assembly 10 is intended to be part of a connected combination 12 which includes a printed circuit board 14, the connector assembly 10, a substrate 16 and an electronic device 18. For purposes of the present invention, the printed circuit board 14 is only exemplary and could be replaced with any other suitable electronic component. Likewise, the electronic device 18 can be any suitable component. Further, the electronic device 18 and the substrate 16 can be integral with each other or connectable to each other in any manner well known in the pertinent art.

As shown in FIG. 1 the substrate 16 (sometimes referred to in the art as a die casting) is formed with a recess 20 for receiving the connector assembly 10 therein. Preferably, the connector assembly 10 is glued into the recess 20 but, it is to be appreciated that the assembly 10 may be otherwise joined to the substrate 16 or only seated in the recess 20. In any event, with the connector assembly 10 positioned on substrate 16, the printed circuit board 14 can be joined to the substrate 16, such as by a threaded engagement using the screws 22a and 22b. With this engagement, the connector assembly 10 is sandwiched between the printed circuit board 14 and the substrate 16 to electrically connect the printed circuit board 14 with the connector assembly 10. The electronic device 18 can then be connected to the connector assembly 10 by the electrical leads 24 which extend from the electronic device 18.

Figure 2:
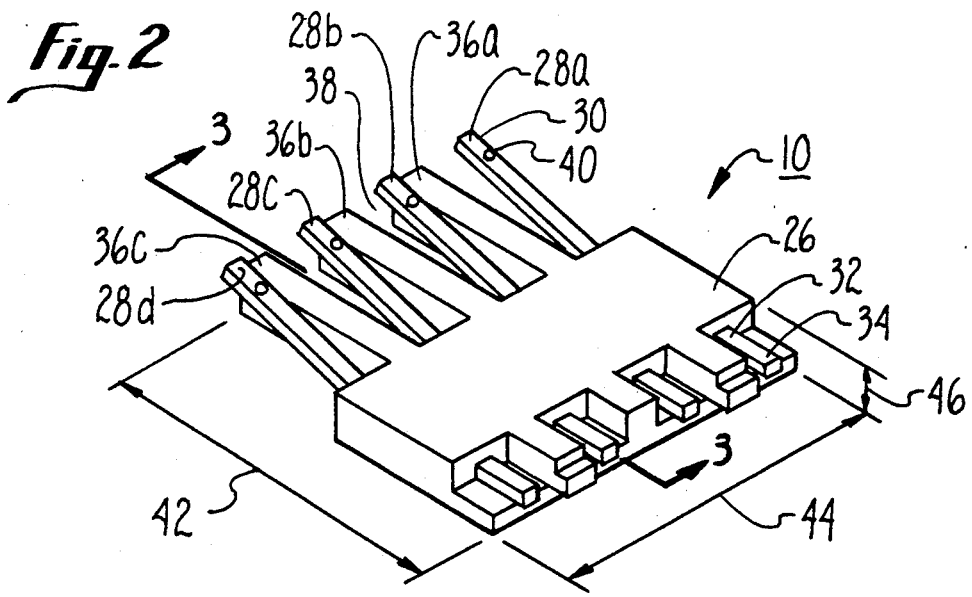
FIG. 2 is a perspective view of the connector assembly.

The actual elements of the connector assembly 10 will, perhaps, be best appreciated by reference to FIG. 2. In FIG. 2 it will be seen that the connector assembly 10 includes a base 26 and that a plurality of contact beams 28 a-d are mounted on the base 26 in a cantilever fashion. As so mounted, the contact beams 28 a-d have similar characteristics. Using the contact beam 28a as an example, it is seen that each contact beam 28 has a free end 30 which is distanced from the base 26 to permit a deflection of the free end 30 when the contact beam 28 is bent. On the other hand, each contact beam 28 also has a fixed end 32 which is rigidly mounted on the base 26. As shown, a portion 34 of the fixed end 32 of each contact beam 28 is exposed to permit an electrical connection of the contact beam 28 with an electrical lead 24 from the electronic device 18.

FIG. 2 also shows that the base 26 is formed with a plurality of reactive beams (support fingers) 36 a-c which extend rigidly from the base 26. These reactive beams 36a-c are each juxtaposed with at least one of the contact beams 28a-d and are positioned on the base 26 to establish recess slots therebetween, of which the slot 38 is exemplary. Preferably, the base 26 and reactive beams 36 a-c are made of plastic which can be formed around the various contact beams 28 a-d to hold the contact beams 28 a-d substantially as shown. The base 26 and reactive beams 36 a-c, however, can be made of any suitable dielectric material known in the pertinent art. Necessarily, the contact beams 28 a-d are made of an electrically conductive material such as a metal.

Figure 3:
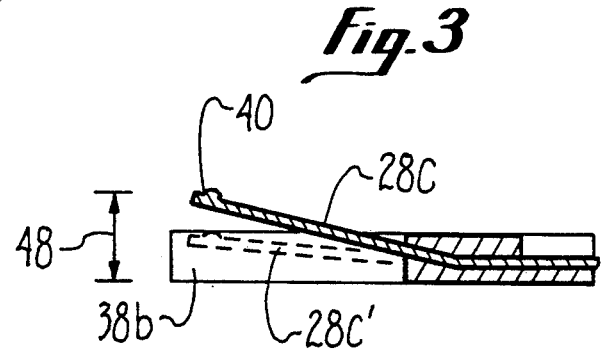
FIG. 3 is a cross-sectional view of the connector assembly as seen along the line 3—3 in FIG. 2.

The bending or deflection of the contact beams 28 will be best appreciated by reference to FIG. 3. There it will be seen that the contact beams 28 are deflectable between a first configuration, represented by the contact beam 28c, wherein the contact beam 28c is in an unstressed state, and a second configuration, represented by the contact beam 28c', wherein the contact beam 28c' is in a stressed state. Consequently, the contact beam 28c' tends to return to its unstressed condition as shown for contact beam 28c.

For the connected combination 12, the connector assembly 10 is positioned in the recess 20 of substrate 16 and the electrical leads 24 of electronic device are connected in a manner well known in the pertinent art to the exposed portions 34 of contact beams 28. The printed circuit board 14 is then joined to the substrate 16 by use of means such as the screws 22a, b. This joining of the printed circuit board 14 to the substrate 16 causes the protrusion 40 on the free end 30 of each contact beam 28 to contact with an electrical pad (not shown) on the printed circuit board 14. Also, this joining causes each contact beam 28 to be deflected or bent from its first configuration (a disengaged configuration) into its second configuration (an engaged configuration). As indicated in FIG. 3, when a contact beam 28 is in the first unstressed disengaged configuration, its free end 30 is poised over the slot 38. On the other hand, when a contact beam 28 is in the second stressed engaged configuration, its free end 30 is pushed or urged into the slot 38. As intended for the present invention, it is the tendency of the contact beam 28 to return from the second configuration to the first configuration which generates the force necessary to establish contact between the contact beam 28 and the printed circuit board.

As indicated above, the miniaturization of a connector assembly as disclosed herein can be of extreme importance in the efficient utilization of available space in a connected combination 12. Accordingly, dimensions are given here in the FIGS. 2 and 3 to provide some appreciation for how small the connector assembly 10 of the present invention may be. For the connector assembly 10 the dimension 42 can be on the order of eight millimeters (8.0 mm), the dimension 44 can be on the order of seven and fifty eight one hundredths millimeters (7.58 mm), the dimension 46 can be on the order of one and one tenth millimeters (1.1 mm), and the dimension 48 can be on the order of one and seven tenths millimeters (1.7 mm). As can be appreciated by cross reference between FIGS. 2 and 3, the deflection of free end 30 on each contact beam 28 between the first configuration and the second configuration will be approximately six tenths of a millimeter (0.6 mm).

While the particular electronic connector assembly as herein shown and disclosed in detail is fully capable of obtaining the objects and providing the advantages herein before stated, it is to be understood that it is merely illustrative of the presently preferred embodiments of the invention and that no limitations are intended to the details of the construction or design herein shown other than as defined in the appended claims.

I claim:

1. A connector assembly for connecting an electronic device with a circuit board which comprises:
   a base;
   a substrate including a recess for receiving said base, said substrate adapted for attachment with said printed circuit board with said base sandwiched between said substrate and said printed circuit board;
   a plurality of bendable contact beams mounted on the base each having a free end cantilevered from said base for movement between a first configuration and a second configuration and a fixed end rigidly mounted on the base exposed to permit an electrical connection to said electronic device; and
   a plurality of rigid reactive beams formed on the base juxtaposed with said bendable contact beams to form a slot for each contact beam, said reactive beams extending from said base generally parallel with said contact beams to hold said base stationary when said contact beam is moved from said first configuration into said second configuration in which said free end electrically contacts said circuit board.

2. An assembly as recited in claim 1 wherein said contact beam in said first configuration is in an unstressed state, and said contact beam in said second configuration is in a stressed state.

3. An assembly as recited in claim 2 wherein each said contact beam has a free end cantilevered from said base for electrical engagement with a printed circuit board attached to said substrate, and each said contact beam has a fixed end attached to said base with a portion of said fixed end being exposed for electrical engagement with electrical leads of the electrical device.

4. An assembly as recited in claim 3 wherein said reactive beams are integral with said base and said reactive beams and said base are made of plastic.

5. An assembly as recited in claim 3 wherein said contact beams are made of metal.

6. An assembly as recited in claim 3 wherein said base is glued to said substrate.

7. A connector assembly for engaging an electronic device with a printed circuit board which comprises:
- a base formed with a plurality of aligned support fingers, said fingers extending from said base to establish recess slots between juxtaposed said fingers;
- a substrate including a recess for receiving said base, said substrate adapted for supporting said printed circuit board such that said base is sandwiched between said substrate and said printed circuit board;
- means for attaching said substrate with said printed circuit board; and
- a plurality of electrical contact beams mounted on said base, generally parallel to said support fingers each said contact beam having an exposed fixed end attached to said base for electrical connection with leads of said electronic device and having a free end disposed for movement between a disengaged configuration wherein said free end is distanced from one of said slots and an engaged configuration wherein said free end is urged into said slot by contact with said printed circuit board supported on said substrate and said free end electrically contacts an electrical pad on said printed circuit board.

8. An assembly as recited in claim 7 wherein each said contact beam is cantilevered on said base for deflection of said free end between said engaged configuration and said disengaged configuration.

9. An assembly as recited in claim 8 wherein each said contact beam in said disengaged configuration is in an unstressed state.

10. An assembly as recited in claim 8 wherein each said contact beam in said engaged configuration is in a stressed state.

11. An assembly as recited in claim 8 wherein said support fingers are integral with said base and said support fingers and said base are made of plastic and wherein said contact beams are made of metal.

12. An assembly as recited in claim 8 wherein said base is glued to said means for engaging said base with said printed circuit board.

* * * * *